US012300967B2

(12) United States Patent
Redman-White et al.

(10) Patent No.: US 12,300,967 B2
(45) Date of Patent: May 13, 2025

(54) METHOD AND SYSTEM FOR CONTROLLING LASER MODULATION

(71) Applicant: Hilight Semiconductor Limited, Southampton (GB)

(72) Inventors: William Redman-White, Southampton (GB); Dominique Coue, Southampton (GB); Colin Whitfield, Southampton (GB)

(73) Assignee: HILIGHT SEMICONDUCTOR LIMITED (GB)

( * ) Notice: Subject to any disclaimer, the term of this patent is extended or adjusted under 35 U.S.C. 154(b) by 173 days.

(21) Appl. No.: 18/074,063

(22) Filed: Dec. 2, 2022

(65) Prior Publication Data

US 2023/0178962 A1   Jun. 8, 2023

(30) Foreign Application Priority Data

Dec. 3, 2021  (GB) ..................... 2117528

(51) Int. Cl.
   *H04B 10/00* (2013.01)
   *H01S 5/06* (2006.01)
   (Continued)

(52) U.S. Cl.
   CPC ........ *H01S 5/06835* (2013.01); *H01S 5/0617* (2013.01); *H01S 5/06233* (2013.01); *H04B 10/503* (2013.01); *H04B 10/516* (2013.01)

(58) Field of Classification Search
   CPC ............... H01S 5/06835; H01S 5/0617; H01S 5/06233; H01S 5/0014; H01S 5/0428;
   (Continued)

(56) References Cited

U.S. PATENT DOCUMENTS

| 5,646,763 A | * | 7/1997 | Misaizu | .............. H04B 10/504 |
| | | | | 372/38.04 |
| 6,057,736 A | | 5/2000 | Kim et al. | |

(Continued)

FOREIGN PATENT DOCUMENTS

| EP | 0545536 | 6/1993 |
| EP | 0577896 | 1/1994 |

(Continued)

OTHER PUBLICATIONS

Hilight Semiconductor Limited; Combined Search and Examination Report for application No. GB2204275.8, mailed Apr. 26, 2022, 11 pgs.

(Continued)

*Primary Examiner* — Agustin Bello
(74) *Attorney, Agent, or Firm* — Taylor English Duma LLP

(57) ABSTRACT

Systems and methods for controlling laser modulation in burst communications. In a start-up phase, a drive circuitry sequentially applies first and second drive currents to a laser diode such that it produces a first and second optical output, respectively. A compensating current source coupled to the laser diode provides a current related to the first and second drive currents to maintain a combined current flowing through an impedance connected to the laser diode at a substantially constant level during the start-up phase. An optical sensor measures the first and second optical outputs, and a controller uses values of the first and second drive currents, the outputs from the optical sensor, and at least one supplied input value to provide control values for the drive circuitry for controlling operating current of the laser diode during a subsequent operating phase, wherein information is transmitted in at least one burst.

20 Claims, 13 Drawing Sheets

(51) Int. Cl.
    *H01S 5/062*       (2006.01)
    *H01S 5/0683*     (2006.01)
    *H04B 10/50*      (2013.01)
    *H04B 10/516*     (2013.01)

(58) Field of Classification Search
CPC ............ H01S 5/06832; H01S 5/06825; H01S 5/0427; H01S 5/042; H01S 3/1305; H01S 3/1306; H01S 5/062; H01S 5/0683; H04B 10/503; H04B 10/516; H04B 10/504; H04B 10/541; H04B 10/564; H04B 10/5057
See application file for complete search history.

(56) References Cited

U.S. PATENT DOCUMENTS

| | | | |
|---|---|---|---|
| 6,307,433 B1 | | 10/2001 | Ikeda |
| 6,629,638 B1 * | | 10/2003 | Sanchez ............... G01R 31/002 |
| | | | 235/455 |
| 10,535,978 B2 * | | 1/2020 | Redman-White .... H04B 10/505 |
| 2002/0175272 A1 | | 11/2002 | Shimizu |
| 2004/0173729 A1 | | 9/2004 | Shimizu et al. |
| 2005/0047801 A1 | | 3/2005 | Schrodinger |
| 2008/0309407 A1 | | 12/2008 | Nakamura et al. |
| 2009/0080905 A1 * | | 3/2009 | Olsson ................... G02B 5/281 |
| | | | 398/187 |
| 2014/0341571 A1 * | | 11/2014 | Noda ................... H04B 10/564 |
| | | | 398/38 |
| 2015/0188627 A1 * | | 7/2015 | Yuda ................... H04B 10/541 |
| | | | 398/30 |
| 2016/0248517 A1 * | | 8/2016 | Parikh .................... H04B 10/58 |
| 2023/0178962 A1 * | | 6/2023 | Redman-White .... H04B 10/564 |
| 2023/0305246 A1 | | 9/2023 | Van Ettinger et al. |
| 2024/0297719 A1 | | 9/2024 | Van Ettinger et al. |

FOREIGN PATENT DOCUMENTS

| | | |
|---|---|---|
| GB | 2535553 | 8/2016 |
| GB | 2552725 | 2/2018 |
| JP | H06252660 | 9/1994 |
| JP | H0774706 | 3/1995 |
| JP | 2006261866 | 9/2006 |

OTHER PUBLICATIONS

Van Ettinger, Rudolf; Search Report for United Kingdom application No. GB2303182.6, mailed May 2, 2023, 4 pgs.
Redman-White, William; Examination Report for United Kingdom application No. GB2117528.6, filed Dec. 3, 2021, mailed Dec. 31, 2021, 6 pgs.

* cited by examiner

METHOD AND SYSTEM FOR CONTROLLING LASER MODULATION

CROSS-REFERENCE TO RELATED APPLICATIONS

This application claims the benefit of U.K. Patent Application No. GB2117528.6 filed Dec. 3, 2021, and entitled "Method and system for controlling laser modulation," which is incorporated by this reference herein in its entirety.

FIELD OF THE INVENTION

Some embodiments relate to a system and method for controlling laser modulation.

BACKGROUND

In a fibre optical communications system it is desirable to be able to control the modulation depth of the light generated by the transmitting laser device. In order to maintain fast switching between states and reduce noise, the transmitting laser is not switched between some defined powers and then switched off, but its output is reduced to a low level. This modulation depth is also described as an extinction ratio (ER), the latter being the ratio of the optical intensity when there is a data '1' and the intensity when there is a data '0'.

The current required by the laser to deliver these relatively high and relatively low optical outputs may not however be constant and may be affected by the tolerances between individual laser devices, and over time due to the variation of a single device's characteristics due to heating and/or ageing. Such variations can occur in normal operation as a device heats up in use. There are existing methods for controlling the modulation, generally intended for systems that run continuously. Some are related to a technique presented by Smith (Electronics Letters, October 1978 pp 775-776), wherein a low amplitude low frequency (LF) modulation is added to the normal laser current. The fluctuations in the optical output from the laser at the known LF modulation frequency permits the estimation of the slope of the laser current/optical output characteristic, and hence the drive currents required for the desired average and modulated optical levels can be calculated provided that the laser characteristic does not have excessive non-linearity. It is thus possible to construct a feedback loop to maintain reasonable control over the modulation depth (or ER) provided that the feedback loop implied in this has time to settle.

However, in some communication systems, for example in passive optical network (PON) applications, it is common for a transmitter to operate in a burst mode, wherein the laser modulation levels should be under control and at specified values after a very few pulses of a run-in sequence. In such cases there may be little time available for a control loop to settle.

Hence it is sometimes desired not only to be able to compensate automatically for manufacturing tolerances and parameter drift of the laser itself, but also to be able to reach a defined target modulation level within a very short time period, and with only a very small number of pulses being passed through the system. Such a period with a sequence of pulses used to establish correct operating conditions is generally referred to as a run-in period.

Techniques for determining suitable levels for the bias and modulation current to provide a required average optical level and required extinction ratio within the timescale of a few run-in pulses have been previously disclosed (for example, GB2535553B and U.S. Ser. No. 10/447,007, Redman-White, Coue and Whitfield). However, while such techniques provide valuable improvements in the settling time for a laser drive control system, in some preferred arrangements for coupling a laser diode to a driver circuit, there remain some limitations. In particular, when an arrangement of circuit components used to couple the laser diode to the driver circuit comprises at least one reactive element, for example an inductance, the settling time for the system may be extended to unacceptable values.

It is the problem of this extended settling time that this invention seeks to reduce to negligible or smaller acceptable values.

SUMMARY

According to an aspect, there is provided a system comprising: drive circuitry configured to apply in a start-up phase a first drive current and then a second different drive current to a laser diode, said first drive current and second drive current being such that said laser diode is configured to provide a first optical output and a second optical output respectively; an optical sensor configured to provide a first sensor output corresponding to the first optical output of said laser diode and a second sensor output corresponding to said second optical output; and a controller configured to use said first drive current, said second drive current, said first sensor output and said second sensor output to provide control values for said drive circuitry to control an average power and a modulation depth of said laser diode optical output.

The drive circuitry may be configured to control a bias current applied to said laser diode and a modulation current applied to said laser diode.

The drive circuitry may be further configured to provide a compensating current to be fed into the arrangement of circuit components coupling the laser to the driver circuitry whose value is configured to maintain the current through said arrangement of coupling components at a substantially constant value during the process of determining the desired bias and modulation current values.

The control values may be configured to control the bias current and modulation current applied by said drive circuitry to said laser diode.

The controller may be configured to use said first drive current value, said second drive current value, said first sensor output and said second sensor output to determine an average current value and a modulation current value and provide control values in dependence on said average current value and said modulation current value.

The controller may be configured to said first current value and said second current value to determine a value for the said compensating current.

The controller may be configured to use said first drive current, said second drive current, said first sensor output and said second sensor output to determine a third current to be applied by the drive circuitry to said laser diode, providing a minimum operational current value, and a fourth current to be applied to said laser diode to provide a maximum operational current value and provide control values in dependence on said third and fourth current values.

The minimum operational current value is used for data '0' and said maximum operational current is used for data '1'

The system may be arranged to be used in a burst communication system and said first and second drive currents are applied within the timing of a single burst.

The system may be arranged to be used in a burst communication system and said first and second drive currents may be applied within the timing of a single burst.

The system may be arranged to be used in a burst communication system and said first and second drive currents may be applied within the timing of a respective bursts.

The optical sensor may comprise a photodiode.

The optical sensor may comprise an analogue to digital convertor configured to convert the output of the photodiode to a digital value to provide said first and second sensor outputs.

The system may comprise a feedback loop configured to use outputs from the optical sensor and one or more stored reference values to compensate for changes in behaviour of said laser diode after said start-up phase.

The drive circuitry may be configured to such that no current is applied to said laser diode and a respective output of said optical sensor is used to correct said first and second sensor output values.

The first and second drive current values may be configured to cause the laser diode to be operated within a substantially linear region of operation.

According to a second aspect there is provided a method for a communication system wherein information is transmitted in at least one burst, said communication system comprising: a laser diode; a drive circuit coupled to said laser diode; a compensating current source coupled to a terminal of said laser diode; an optical sensor; and a controller, said method comprising: applying, by said drive circuitry in a start-up phase prior to an operating phase, a first drive current and then a second drive current to said laser diode, said first drive current and second drive current being different and such that said laser diode is configured to provide a first optical output and a second optical output respectively; applying, by said compensating current source in said start-up phase, a compensating current related to said first and second drive currents and configured to maintain a combined current flowing through at least one impedance connected to said laser diode at a substantially constant level during said start-up phase; providing, by said optical sensor, a first sensor output corresponding to said first optical output of said laser diode and a second sensor output corresponding to said second optical output; and providing control values by said controller, said control values comprising control values for said drive circuitry to control an operating current of said laser diode during said operating phase wherein said information is transmitted in said at least one burst, said control values based on a value of said first drive current, and a value of said second drive current, said first sensor output, said second sensor output and at least one supplied input value.

Said operating current may comprise an average current and a modulation current, and providing control values by said controller, may comprise: using said value of said first drive current, said value of said second drive current, said first sensor output and said second sensor output and said at least one supplied input value to determine an average current value and a modulation control value; and providing control values in dependence on said average current and modulation control values.

Said at least one impedance may be connected between said laser diode and a system power supply.

Said at least one impedance connected between said laser diode and said system power supply may comprise at least one inductance.

Providing control values by said controller may further comprise providing compensating control values to said compensating current source, wherein providing said compensating control values may comprise: determining respectively a first value and a second value of said compensating current such that said total current passing through said impedance connected between said laser diode and said power supply remains substantially constant during said provision of said first and second drive currents; and generating a first compensating control value dependent on said first value of said compensating current and a second compensating control value dependent on said second value of said compensating current.

The method may further comprise providing, by said drive circuitry, said average current and said modulation current to said laser diode based on said control values.

Said operating current may comprise a maximum operational current and a minimum operational current to be provided by said drive circuitry to said laser diode, and providing control values by said controller may comprise: determining a minimum operational current value and a maximum operational current value to be provided by said drive circuitry to said laser diode; and providing said control values in dependence on said maximum operational current value and said minimum operational current value.

Providing control values by said controller may comprise providing said maximum operational current value and said minimum operational current value to said laser diode based on said control values.

Said minimum operational current value may be used for data '0' and said maximum operational current may be used for data '1'.

Said operating current may comprise a bias current and a modulation current and providing control values by said controller may comprise: determining a bias current value and a modulation control value; and applying said control values to said drive circuitry in dependence on said bias current value and said modulation control value.

The method may further comprise providing, in said operating phase, by said drive circuitry said bias current applied to said laser diode and said modulation current applied to said laser diode based on said control values.

Providing, by said drive circuitry in said start-up phase prior to said operating phase, said first drive current and then said second drive current to said laser diode, may comprise providing said first and second drive currents within a timing of a single burst.

Providing, by said drive circuitry in said start-up phase prior to said operating phase, said first drive current and then said second drive current to said laser diode, may comprise providing said first and second drive currents are provided within a timing of respective bursts.

Said optical sensor may comprises a photodiode.

Said optical sensor may comprise an analogue to digital convertor.

Providing, by said optical sensor, said first sensor output corresponding to said first optical output of said laser diode and said second sensor output corresponding to said second optical output may comprise converting, by said analogue to digital converter, said output of said photodiode to a digital value representing said first sensor optical output of said laser diode and a digital value representing said second sensor output corresponding to said second optical output photodiode to a digital value to provide said first and second sensor outputs.

An impedance may be connected to a terminal of said laser diode not connected to said at least one inductance.

The system may comprise a feedback loop configured to use outputs from said optical sensor and one or more stored reference values to compensate for changes in behaviour of said laser diode after said start-up phase.

Said drive circuitry may be configured such that when no current is applied to said laser diode a respective output of said optical sensor is used to correct said first and second sensor output values.

Said first and second drive current values may be configured to cause said laser diode to be operated within a substantially linear region of operation.

According to a further aspect, there is provided a method for communications using at least one burst comprising: applying to a laser diode in a start-up phase a first drive current and then a second different drive current to a laser diode, said first drive current and second drive current being such that said laser diode is configured to provide a first optical output and a second optical output respectively; providing a first sensor output corresponding to said first optical output of said laser diode and a second sensor output corresponding to said second optical output; and using a value of said first drive current, a value of said second drive current, said first sensor output, said second sensor output and said at least one supplied input to provide control values to control an operating current of said laser diode; applying a compensating current to a terminal of said laser diode, said compensating current being configured to maintain a combined current flowing through at least one impedance connected to said laser diode at a substantially constant level during the said start-up phase; providing a controller configured to use a value of said first drive current, a value of said second drive current, said first sensor output, said second sensor output and at least one supplied input value to provide control values for said drive circuitry to control an operating current of said laser diode during the operating phase wherein the information is transmitted in the at least one burst, and to further supply a first and second value of said compensating current during said start-up phase.

Said operating current provided in said method may comprise an average current and a modulation current, and said controller may be configured to use said value of said first drive current, said value of said second drive current, said first sensor output and said second sensor output and said at least one supplied input to determine an average current value and a modulation control value and provide control values in dependence on said average current and modulation control values.

Said at least one impedance present in embodiments according to said method may be connected between said laser diode and said system power supply.

Said at least on impedance present in embodiments according to said method may comprise at least one inductance.

Said controller present in embodiments according to said method may be configured to use said value of said first drive current, said value of said second drive current to determine respectively a first value of a compensating current and a second value of a compensating current such that the total current passing through said impedance connected between said laser diode and said power supply remains substantially constant during said provision of said first and second drive currents.

Said means for providing said drive current present in embodiments according to said method may be configured to provide said average current applied to said laser diode and said modulation current applied to said laser diode based on said control values.

Said operating current provided in said method may comprise a maximum operational current and a minimum operational current to be applied to said laser diode, and said controller may be configured to use said value of said first drive current, said value of said second drive current, said first sensor output, said second sensor output and said at least one supplied input to determine a minimum operational current value to be applied to said laser diode and a maximum operational current value to be applied to said laser diode and provide control values in dependence on said maximum operational current value and said minimum operational current value.

Said means for providing said drive current present in embodiments according to said method may be configured to provide said maximum operational current value and said minimum operational current value applied to said laser diode based on said control values.

Said minimum operating current provided in said method may be used to represent a data '0' and said maximum operational current may be used to represent a data '1'.

Said operating current provided in said method may comprise a bias current and a modulation current to be applied to said laser diode and said controller may be configured to use said value of said first drive current, said value of said second drive current, said first sensor output, said second sensor output and at least one supplied input to determine a bias current value and a modulation control value and apply control values in dependence on said bias current value and said modulation control value.

Said means for providing said drive current present in embodiments according to said method may be configured to provide said bias current to said laser diode and said modulation current to said laser diode based on said control values.

Said first and second drive currents provided in said method may be configured to be applied to said laser within a single timing burst.

Said first and second drive currents provided in said method may be configured to be applied to said laser within respective timing bursts.

Said sensor output provided in said method may be provided by means including a photodiode.

Said sensor output provided in said method may be provided by means including an analogue to digital converter to convert the output of said photodiode to a digital value to provide said first and second sensor outputs.

Said laser present in embodiments according to said method may be connected to at least one impedance wherein said at least one impedance may be connected to a terminal of the said laser not connected to said at least one inductance.

Said means for providing said drive current present in embodiments according to said method may further comprise a feedback loop configures to be configured use outputs from said optical sensor and one or more stored reference values to compensate for changes in behaviour of said laser diode after said start-up phase.

Said means for providing said drive current present in embodiments according to said method may be configured such that when no current is applied to said laser diode a respective output of said optical sensor may be used to correct said first and second sensor output values.

Said means for providing said drive current present in embodiments according to said method may be configured to cause said laser diode to be operated within a substantially linear region of operation.

In the above, many different embodiments have been described. It should be appreciated that further embodiments may be provided by the combination of any two or more of the embodiments described above.

BRIEF DESCRIPTION OF FIGURES

Some embodiments will now be described by way of example only and with reference to the accompanying drawings in which.

DETAILED DESCRIPTION

Some embodiments will now be described by way example only.

Figure 1A:
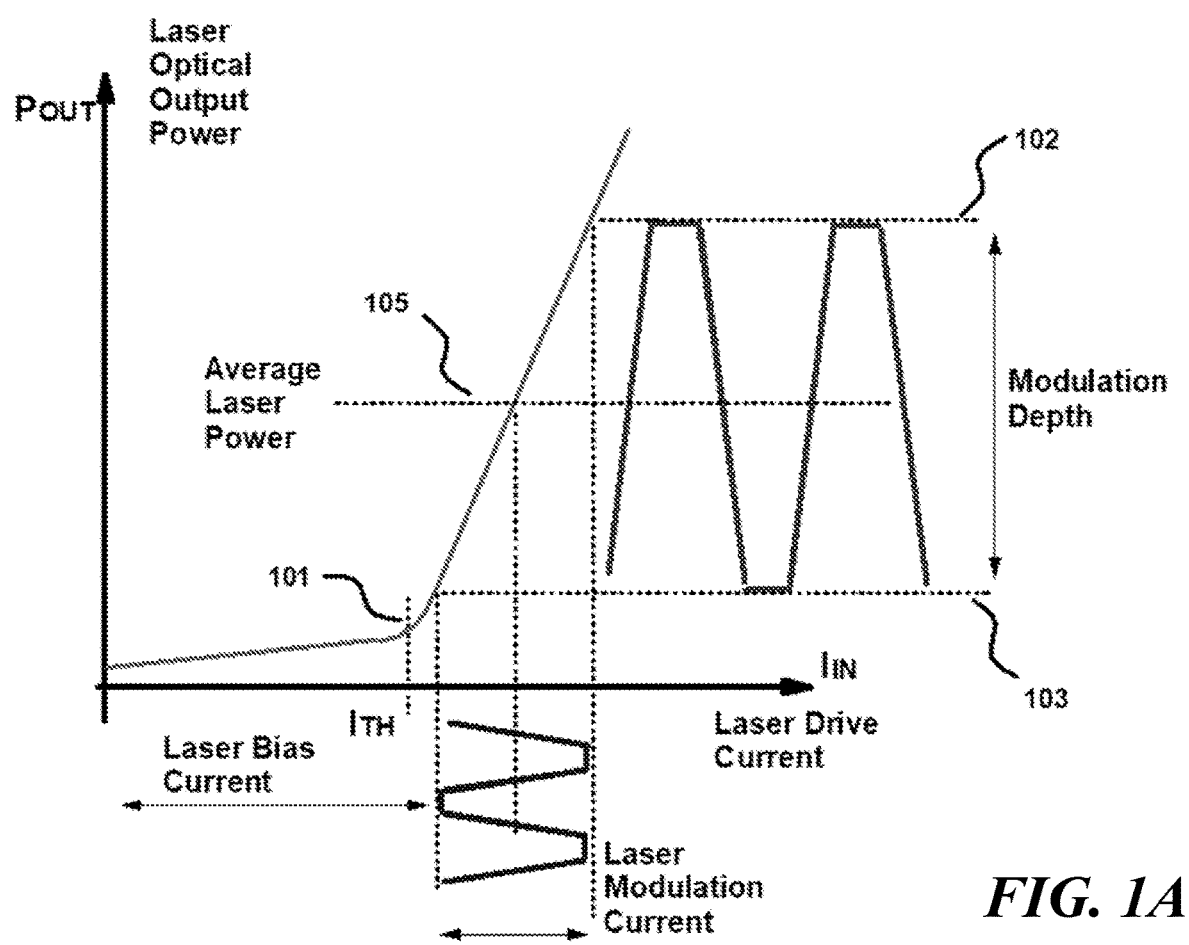
FIG. 1a shows a graph showing optical power against laser drive current for a laser, which shows modulation depth and modulation current.
Figure 1B:
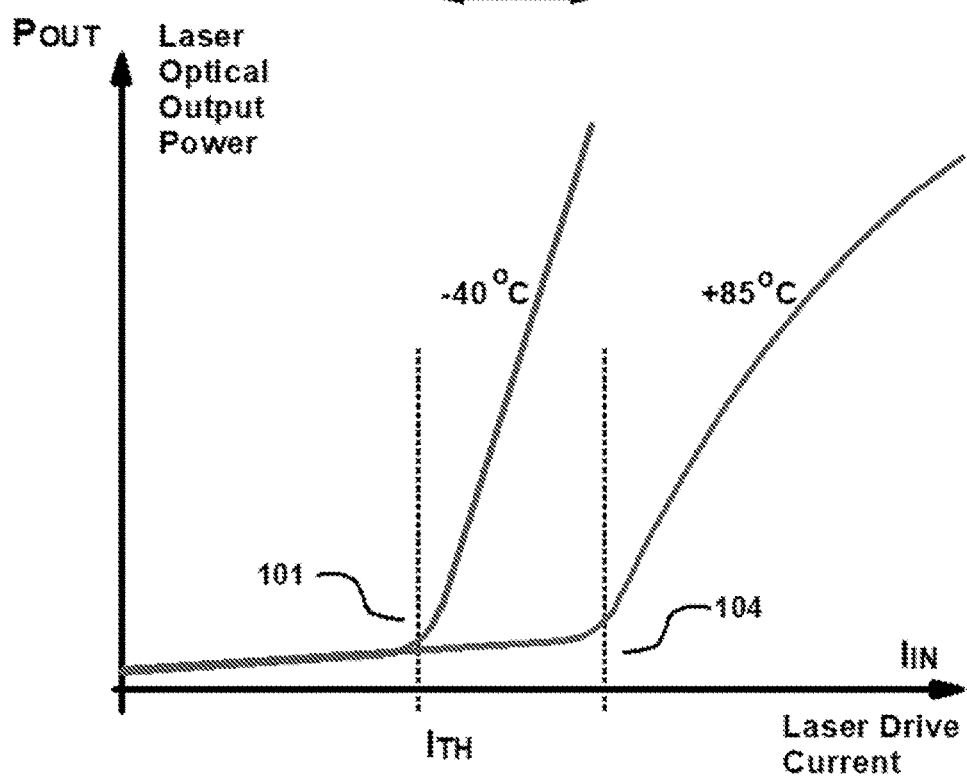
FIG. 1b shows a graph showing optical power against laser drive current for a laser operating at two different temperatures.

FIGS. 1a and 1b show a representation of the characteristics of a typical laser in terms of the optical output power versus the supplied current. When the current is below a certain threshold 101 there is no output, and above this the output is often approximated as being linear with current. The value of the threshold current 101 varies from device to device and also varies with junction temperature, particularly as the device heats up when in use. The characteristic can also show some non-linearity as temperature increases.

For fast switching and for a low noise in the optical signal, the modulation of the optical output is between a relatively high and a relatively low level, rather than switching on and off. The average power output of the laser is controlled in order not to exceed maximum ratings of the laser and to respect any system level power specifications.

The laser characteristic (laser optical power outputs versus laser drive current) is often represented as a substantially straight line above the threshold current, and this is not unreasonable at moderate currents and lower operating temperatures. As the laser is driven harder with larger currents and heats up, the characteristic becomes less linear and flattens at higher current. FIG. 1b shows a representation of the characteristics for a typical laser at −40° C. and at 85° C. respectively. As can be seen, the threshold current increases 104 with temperature and the characteristics of the laser diode are less linear at higher temperatures as compared with at lower temperatures.

Due to this departure from an ideal linear characteristic, if accurate control of the laser is needed over a wide range of power and temperature levels, it may be desirable to provide a control loop that does not rely on the assumption of a linear characteristic. However, in some embodiments, this may not be a concern. In some embodiments, the bias and modulation currents may be set at the start of a burst of operation. As a consequence, the laser can be assumed to be at or close to ambient temperature, where the characteristic is substantially linear. As the laser heats up, during the course of a data burst, then the values of the bias and modulation currents may be controlled by a more precise feedback system.

The modulation of the light output between relatively high 102 and relatively low 103 levels may be described in terms of modulation depth with the average laser power 105 being between these two levels. The modulation of the light output between relatively high and relatively low levels may be described alternatively as the extinction ratio (ER), the latter being the ratio between the relatively high level and the relatively low level. The modulation depth is shown in FIG. 1a. FIG. 1a also shows the laser modulation current.

In some embodiments the laser bias current is the laser drive current associated with the relatively low level. The bias current may be slightly larger than the threshold current. The laser modulation current is then the associated current which provides the modulation depth and is added to the bias current to provide an optical high level.

In other embodiments the bias current may be set so as to provide an optical level that is substantially equivalent to the desired optical average level. In such other embodiments the modulation current is subtracted from the bias so as to provide a desired low (or '0') symbol level, and similarly added to the bias current to provide a desired high (or '1') symbol level.

The ER may also conventionally be given in dB. This parameter determines the receiving function's ability to discriminate between the '1' and '0' symbol levels. Hence in order to ensure that in use the average laser output is well defined and that the ER is also within defined limits it is desirable to be able to determine and control the currents required for the optical high and optical low.

Figure 2:
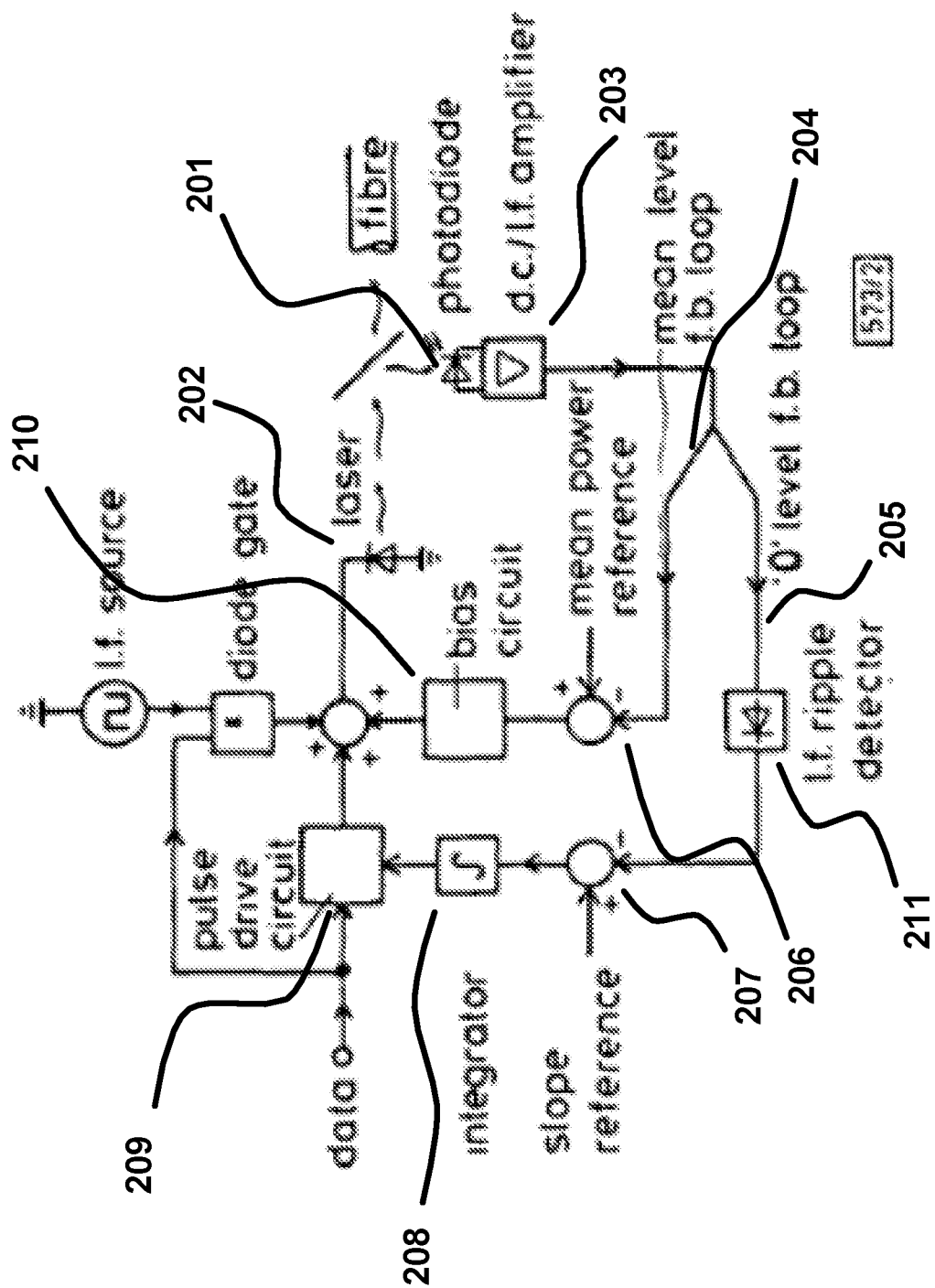
FIG. 2 shows a feedback arrangement for controlling laser modulation and bias according to a prior art arrangement.

Techniques for controlling the average output and modulation of the laser are known in continuous mode fibre optic communications systems. FIG. 2 shows an example of such a system (due to Smith, Electronics Letters, October 1978 pp 775-776). The objectives of this system are to compare the optical levels with defined reference values and hence maintain the average and the ER despite tolerances, ageing and temperature fluctuations. Typically, a monitor photodiode 201 is fixed close to a transmitting laser diode 202 in order to receive a small fraction of the outgoing light signal. In the example system shown in FIG. 2, a low frequency (LF) modulation is added to the laser drive current. The signal from the monitor photodiode 201 representing the average is compared with a reference 206 so that the bias circuit 210 can maintain the average current in the laser. A detector 211 extracts the signal component containing the LF modulation from the monitor diode and this is used to estimate the slope of the laser characteristic. Comparing this with a reference for the slope 207 permits the modulation level to be set 209 and maintained.

A feature of control systems such as shown in FIG. 2 is that a feedback loop is used, and within this feedback loop there are typically filtering integrating and averaging functions 208 that of necessity have long time constants. Clearly, for an optical link operating in a continuous steady state, longer averaging times generally mean more accurate estimates of the desired power and modulation levels, and so there is a conflict between the requirements of fast settling and accurate control of power and ER.

An additional concern is that the combination of several time constants in such systems may lead to a second or higher order response such that it is possible to observe an overshoot in the settling behaviour.

In the case of a burst mode communications link, such time as may be required for the settling of such a feedback loop is unlikely to be available. It is also possible that a feedback loop constructed to settle quickly may exhibit overshoot, leading to possibly damaging current being supplied to the laser diode. On the other hand, if a longer run-in is required for each data payload, the overall capacity of the communication system may be restricted. Further, in some arrangements of circuit elements used to couple the laser to the driver circuits, there may be included reactive components such as inductors that may further delay the settling of circuit conditions and impede the gathering of reliable information required for determining the desired operating current levels within acceptable time scales.

It is an aim of some embodiments to eliminate the requirement for allowing a long settling time in the control of the modulation depth (ER) as well as the average optical power in a burst mode system. This may be achieved by using quantitative information derived from driving the laser during a small number of run-in bursts or pulses, and using this information to set the initial conditions in the control loop. For example, the small number of run-in bursts or pulses may be two or more than two. It is a further aim of some embodiments to minimise the impact of passive reactive circuit elements associated with the laser which may otherwise give rise to settling times in the operation of the system that interfere with the process of determining the desired current levels within the desired time scales.

Figure 3:
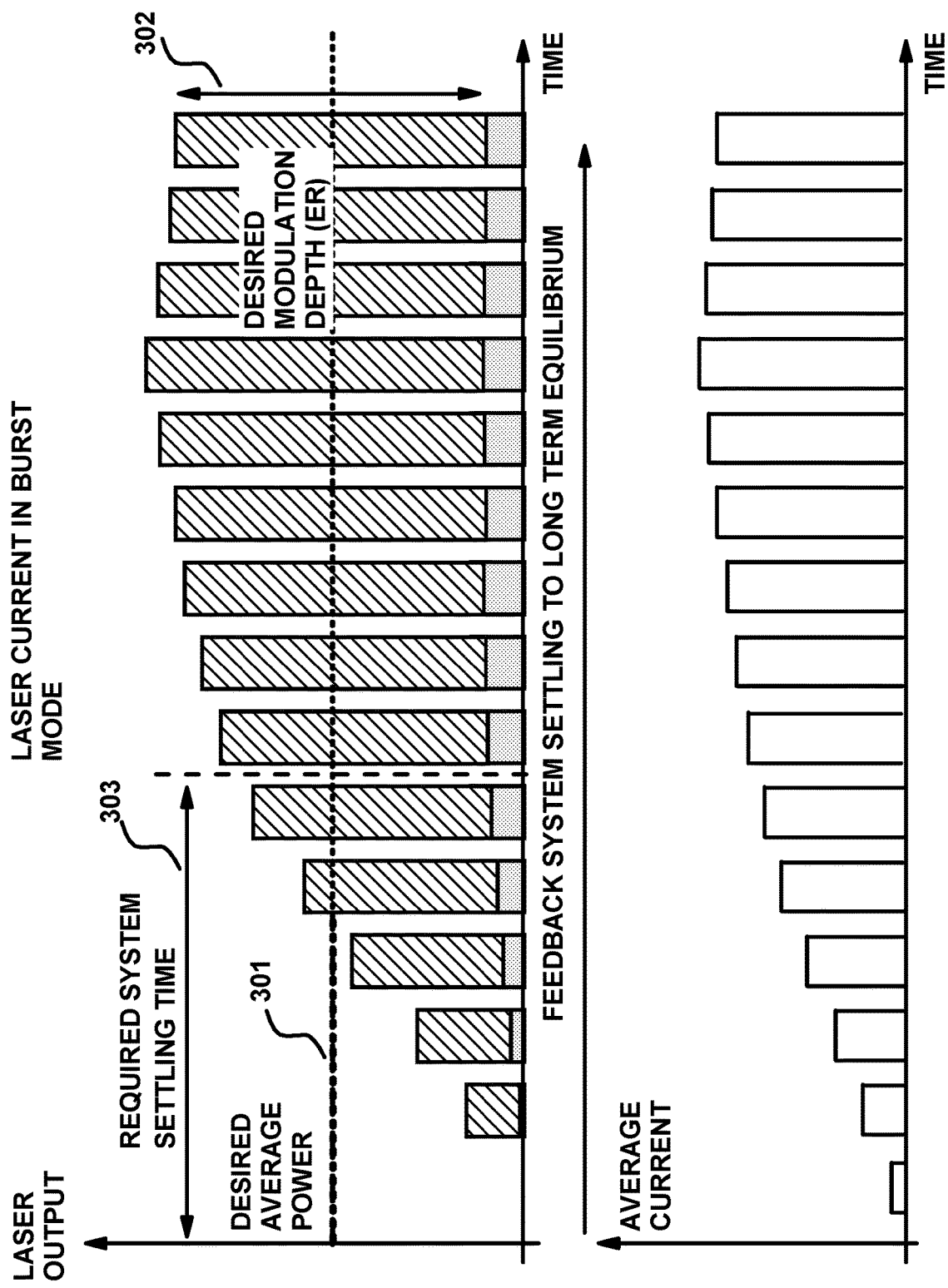
FIG. 3 shows a burst mode communications link at the start of a burst of data and the typical response of the laser and the drive current with a conventional feedback loop controlling the laser.

FIG. 3 shows a representation of the optical levels in a burst mode optical communications system, where a control system of the abovementioned type shown in FIG. 2 is used to maintain the desired ER 302 and desired average power 301. FIG. 3 shows in the first graph laser power output against time and in the second graph average current against time. The slow settling behaviour of the control loop leads to a long settling time in the start-up phase, with the likelihood that the average power and ER are not correctly defined within the run-in period 303 specified in the relevant standard. This type of burst mode system typically has agreed specifications that require that full performance is established within of the order of 5 run-in bursts, each of the order of, for example, only 200 ns or less. From the user's perspective, settling to full performance in the least number of bursts is advantageous. Further, if there is a second or higher order response in the control loop, there may be overshoot in the settling with a risk of exceeding the laser's maximum ratings.

It is a further aim of some embodiments to provide a means of establishing correct and stable operating conditions for the transmitting laser diode within a relatively short time period, requiring only a minimum number of bursts in a run-in period, in such a way that it is also possible to use long time constants in the control system once started and hence maintain smooth control of power and ER when the link is active.

Figure 4:
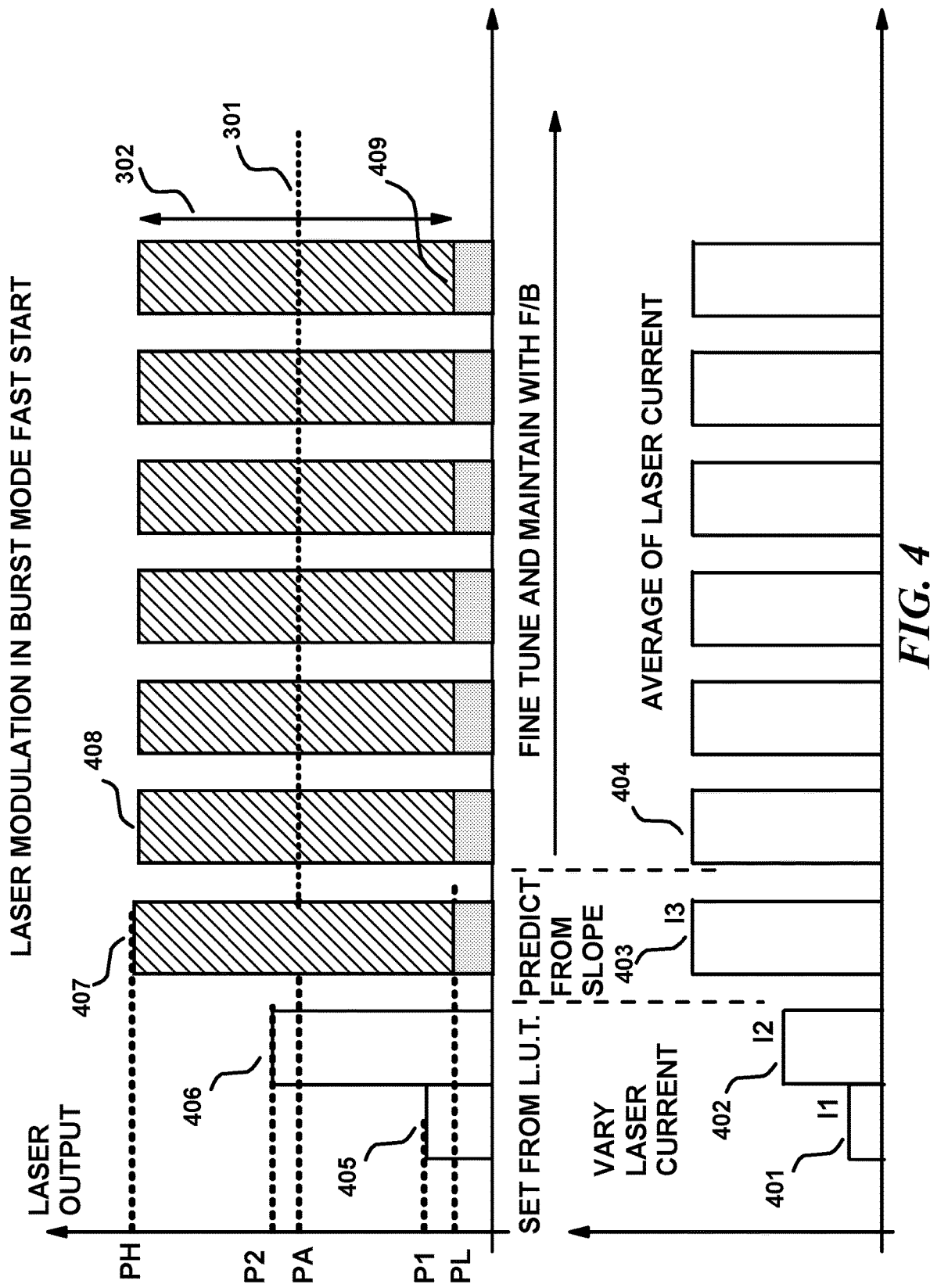
FIG. 4 illustrates the use of two bursts or pulses during a data run-in to provide information regarding the laser characteristic according to a prior art arrangement.

FIG. 4 shows a representation of bursts generated as part of the run-in intended to provide rapid settling of the laser drive current values to provide the desired optical high 408 and optical low 409, and hence average power level 301 and ER 302 in an embodiment of a system according to prior art. In this embodiment, the output levels of the first two bursts or pulses are deliberately set at different values below the expected operating level. These levels are based on stored values derived either from factory calibration or from automatic calibration updates derived in normal operation. This method is described in more detail later.

In the first burst or pulse 405, a defined fixed current 401 without data modulation is supplied to the laser at a level expected to result in a moderate output, for example at less than 50% of the expected operating output. The corresponding optical output level is determined from the monitor diode signal and this value is stored. For the second burst or pulse 406, the current supplied to the laser is increased to a higher level 402 to give a higher optical output to deliver, for example, 75% of the normal operating output. Again, the optical power level observed by means of the monitor diode is measured and stored. A simple calculation can then be performed to determine good estimates of the slope and threshold values for the laser characteristics, and hence the initial current settings for the bias current and the modulation current needed for the correct average power and ER.

It will be obvious to one skilled in the art that the precise duration and timing intervals of the first two calibration bursts are not constrained by the specification of the particular communications system in use for the application. In some embodiments it may be convenient to respect the burst timing input from the host system in the form of a "burst enable" signal. However, in some other embodiments, the only restriction may be that the bursts are long enough for the monitor diode signal to be measured at the optical level corresponding to the current supplied in that burst. One convenient method is to apply two different laser drive currents during a single defined burst duration. In this way, it may be possible to have the system calibrated before the second burst interval.

Figure 5:
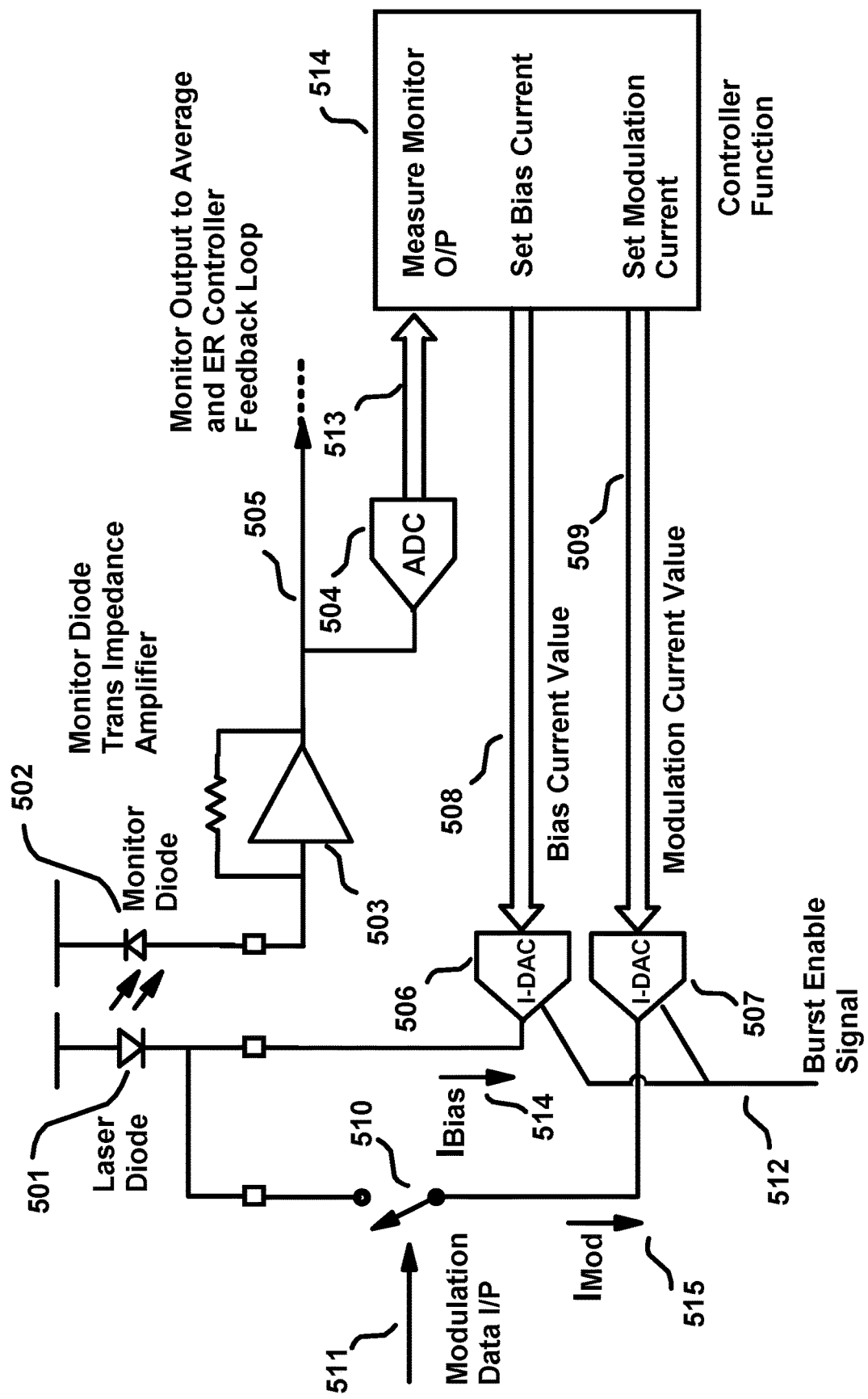
FIG. 5 illustrates determining the desired laser drive current level from the levels observed in the run-in bursts or pulses according to an embodiment of prior art.

FIG. 5 shows an example of a system that can perform the desired functions according to one embodiment. One skilled in the art will immediately recognise that many other arrangements of circuitry and components can be employed to achieve substantially the same or similar result.

A transmitter laser diode 501 is supplied with bias current 514 from a current mode digital to analogue converter (DAC) 506 and a modulation current 515 from another current mode DAC 507. The modulation current is supplied by the modulation current DAC 507 which is switched on and off by a modulator 510 under the control of a data input 511. The modulator 510 is provided in the path between the modulation current DAC 507 and the laser diode 501. Both currents may be switched off together by the action of a burst enable control signal 512 input to each of the current DACs 506 and 507.

The optical output of the laser 501 is monitored by a provided monitor photodiode 502 positioned adjacent to the laser diode. The monitor diode creates current that is converted to a voltage 505 by a transimpedance amplifier (TIA) 503 connected with the photodiode 502. The output 505 of the monitor TIA is fed to an average control loop and an ER control feedback loop (not shown in the figure) and to controller 514 via an ADC (analogue to digital converter) 504. The digital output 513 of the ADC 504 is provided as an input to the controller 514.

In some embodiments, the monitor diode and associated TIA may have a bandwidth lower than the signal bandwidth, and the control systems may be configured to take this into account.

When running in a continuous mode, or with a long sequence of data bursts, digital values 508 controlling the bias current and digital values 509 controlling the modulation current are determined by the feedback loop control, and remain relatively stable, changing slowly with temperature. However, at the initiation of a data burst the control of the values 508 and 509 may be defined by the fast start algorithm which may be run by the controller 514.

Figure 6:
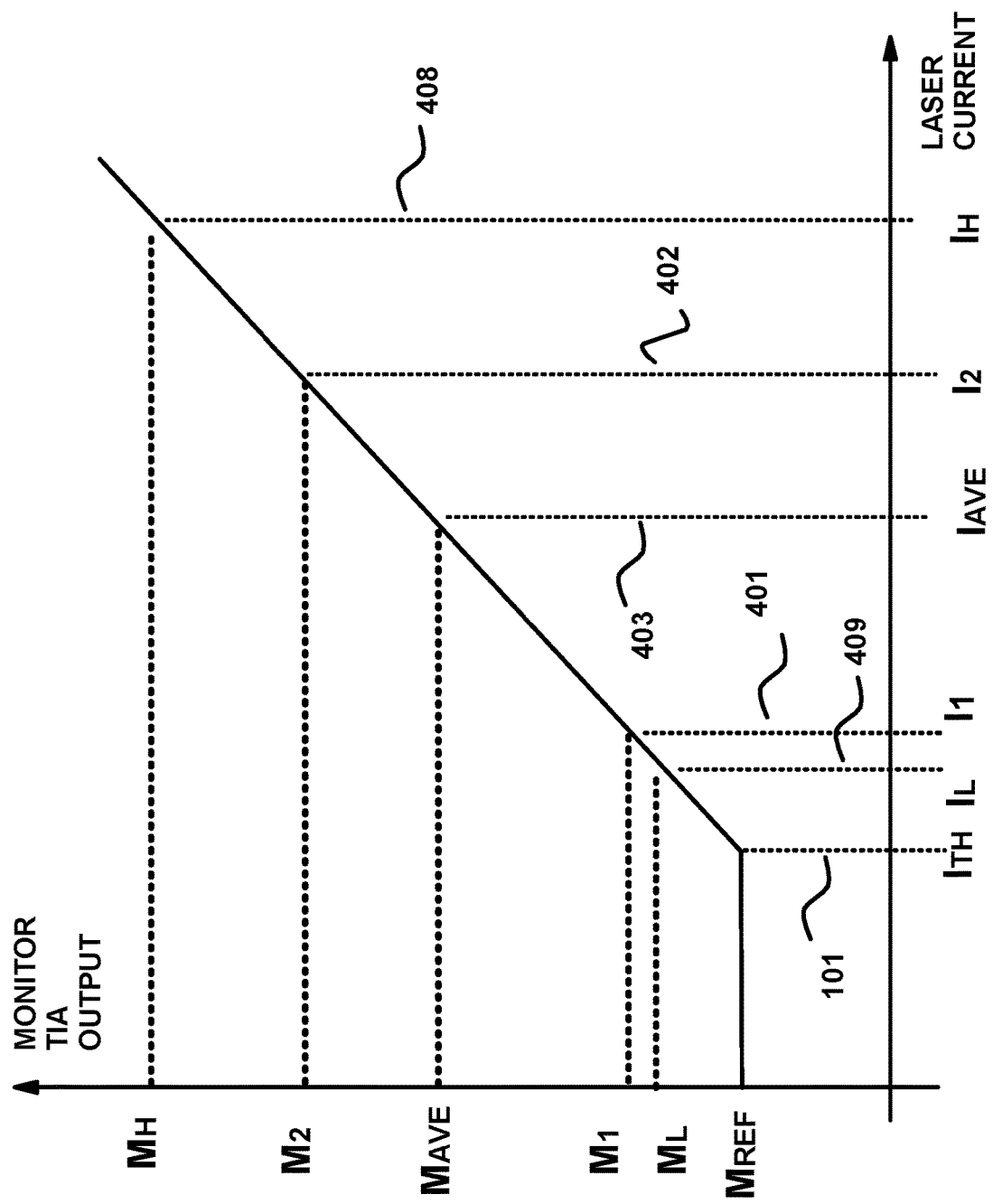
FIG. 6 schematically shows an arrangement wherein a laser is driven with a bias and modulation current according to an embodiment of prior art.

FIG. 6 shows diagrammatically how the use of at least two defined laser values during the run-in to a data burst can provide the information to the algorithm which performs the calculation. $M_{REF}$ is the level observed at the output of the monitor TIA when there is no current in the laser, and represents the effects of leakage currents and amplifier offsets. $I_1$ is the calibration current 401 applied to the laser in a first calibration bust or pulse 405, and $M_1$ is the corresponding monitor TIA output observed. $I_2$ is the calibration current 402 applied to the laser in a second calibration burst or pulse 406, and $M_2$ is the corresponding monitor TIA output observed. These calibration currents are preferably applied by varying the value of the bias current. IAVE is the desired average laser current 403 to be used for the subsequent data transmission, and $M_{AVE}$ is the corresponding level observed at the monitor TIA output. $I_H$ and $I_L$ are the laser currents required for signalling a "1" level and for signalling a "0" level respectively at the desired ER 302. $M_H$ and $M_L$ are the corresponding "1" and "0" levels that would be observed in a steady state at the output of the monitor TIA.

The required values of $I_{AVE}$ and the ER value, as desired for the subsequent normal operation of the laser, may be conveniently stored in advance in a local memory. The calibration current values $I_1$ and $I_2$ are also needed to perform the calculation, but these do not have to be any specific values, but rather fulfil the conditions that they are both within the normal operating range of the laser. The values may be conveniently stored in a local memory or look up table taking account the specifications of the particular laser being used, and optionally other factors such as ambient temperature. The values of $I_1$ and $I_2$ should preferably differ sufficiently such that the required computations can be made simply without significant rounding errors, for example if the calculation is to be made using limited range integer representations of the values.

An example of one method of performing the calculation is as follows:

$$S = \frac{M_2 - M_1}{I_2 - I_1} = \frac{M_1 - M_L}{I_1 - I_L} = \frac{M_H - M_2}{I_H - I_2}$$

and $$ER = \frac{M_H - M_{REF}}{M_L - M_{REF}}$$

$$I_{AVE} = \frac{I_H - I_L}{2}$$

$$M_{AVE} = \frac{M_H - M_L}{2}$$

So that $$M_{AVE} = S(I_{AVE} - I_1) + M_1$$

Hence $$M_L = \frac{2M_{AVE} + M_{REF}(ER - 1)}{(ER + 1)}$$

Resulting in $$I_L = \frac{(M_L - M_2)}{S} + I_2$$

Similarly we can derive $$I_H = \frac{(M_H - M_1)}{S} + I_1$$

In this example, the laser operating current has been defined in terms of the minimum and maximum currents representing the "1" and "0" levels. The bias and modulation currents can be derived from these values in a manner suitable for the particular implementation of the laser modulator. In the case of a DC modulator as depicted in FIG. 5, the bias current is equivalent to $I_L$, and the modulation current is equivalent to ($I_H$–$I_L$). These current values are then used as the initial operating values, and are then adjusted by any feedback system, for example as shown in FIG. 2, to take account of heating of the laser, or of possible deviations of the laser's current vs optical power characteristic from a simple linear model.

It will be obvious to one skilled in the art that there are many ways in which to make the required calculations or determinations and define the operating currents, for example when the modulation is applied as an alternating current that is added and subtracted from an average bias current value.

Figure 7:
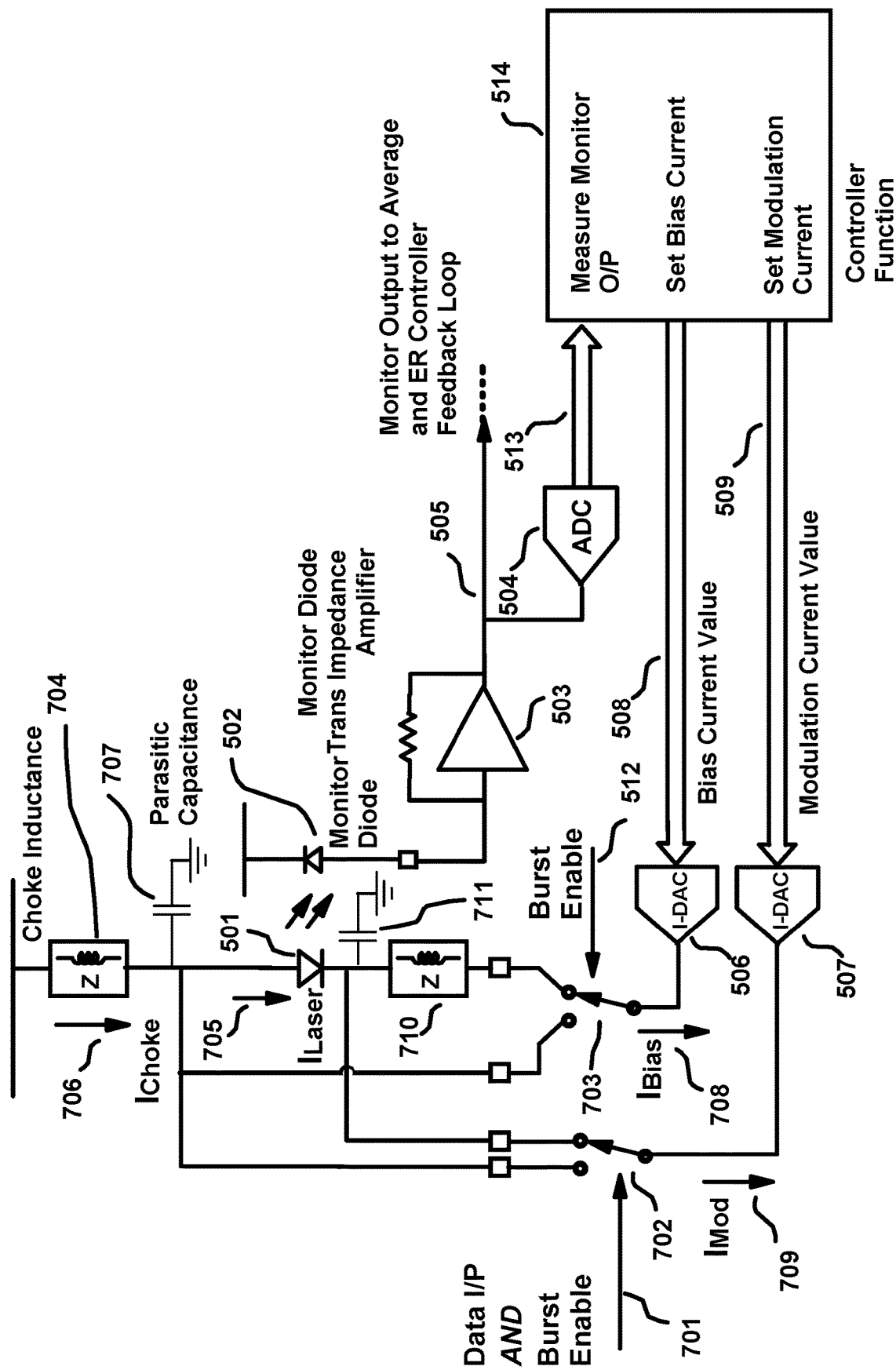
FIG. 7 shows an arrangement wherein an arrangement of circuit elements is used for coupling a laser according to prior art.

FIG. 7 shows an arrangement of circuit elements used for coupling a laser diode to the associated driver circuitry according to prior art. In this arrangement series impedances 704, 710, are present connected with the laser 501, to modify and improve the pulse response of the laser's optical output. In this figure these impedances are represented by choke inductances, approximating to the most significant elements of the impedances in a typical application. One skilled in the art will immediately recognise that there are a great many possible variations in such impedances whose nature will depend on the physical construction of the complete transmit optical sub-assembly (TOSA), and each may comprise more than one element. To facilitate activation of the laser during a defined data burst, a switching function 703 is provided in series with the bias current DAC 506. Said switching function selects between on the one hand supplying the bias current 708 to the laser and on the other hand diverting said current past the laser to a connection with the choke impedance 704. Similarly, to facilitate modulation of the laser current, a modulation switching function 702 is provided, selecting between on the one hand supplying additional current to the laser, and on the other hand, diverting said current past the laser to a connection with the choke impedance 704.

In the course of normal operation, during each burst the current through the inductance 704 is approximately constant, and a long time constant associated with the choke impedance is generally desirable. When the calibration pulses or bursts of current 401, 402 are applied during the start-up phase, the net current through the laser is held relatively steady for sufficient time for the monitor photodiode channel to be able to reliably sense the level of the laser output. In the intervals between individual bursts, the modulation switching function 702 and the bias current switching function 703 are configured so as to divert both of said currents away from the laser and through the choke impedance 704 before returning the combined total current to the power supply.

Figure 8:
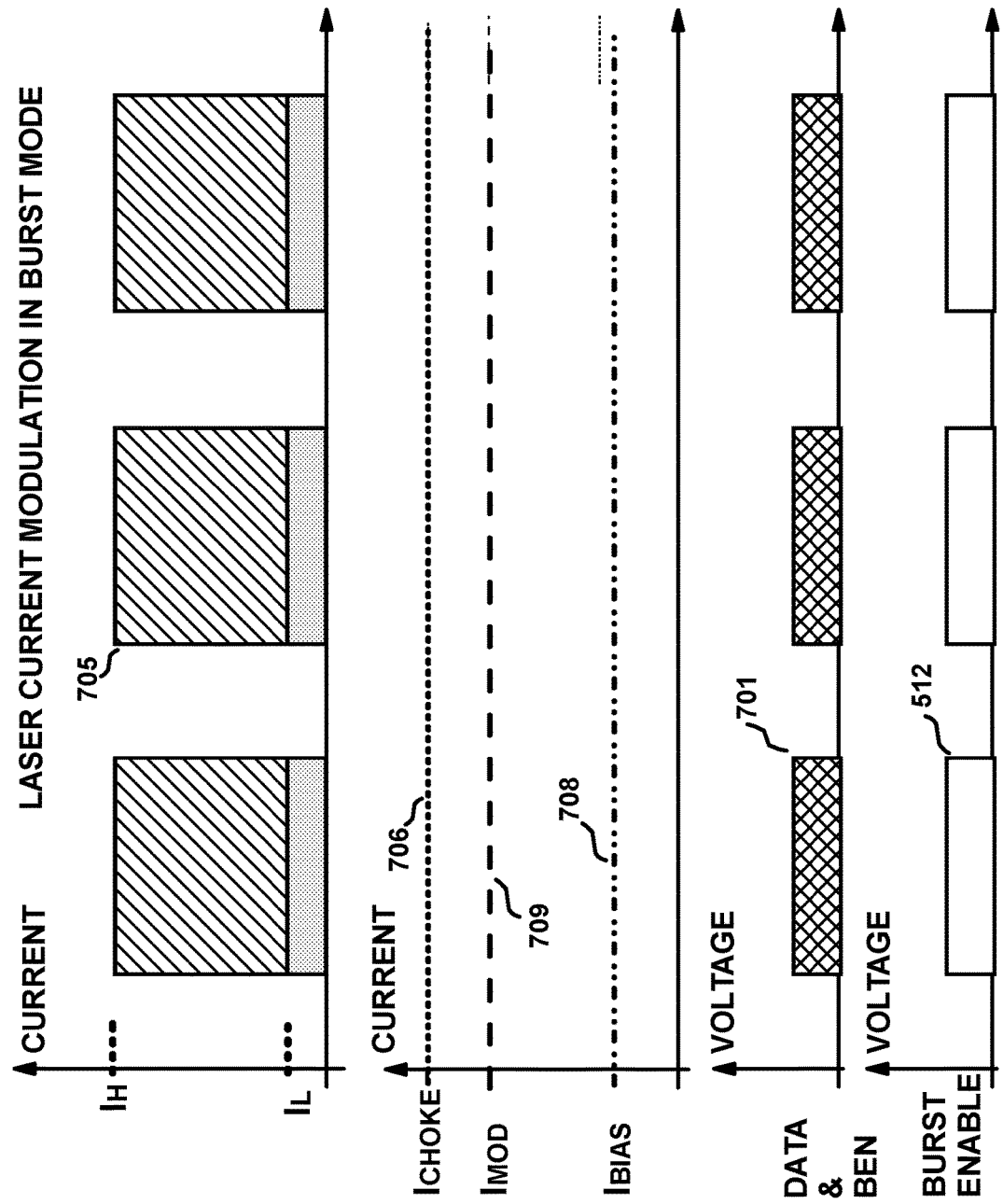
FIG. 8 shows a representation of ideal currents during normal data bursts in arrangement for driving a laser according to prior art.

FIG. 8 shows a representation of the idealised currents in the arrangement shown in FIG. 7. Note that the switching function 703 in series with the bias current 708 is controlled by the bust enable signal 512 and the switching function 702 in series with the modulation current 709 is controlled by a signal 701 which is formed from a suitable logical combination of the Data signal with the Burst Enable signal. If there are no other factors apparent, then the current 706 through the choke impedance 704 will remain substantially constant both during data bursts (when the Burst Enable signal 512 is asserted) and between bursts of data transmission when the Burst Enable signal is not valid.

Figure 9:
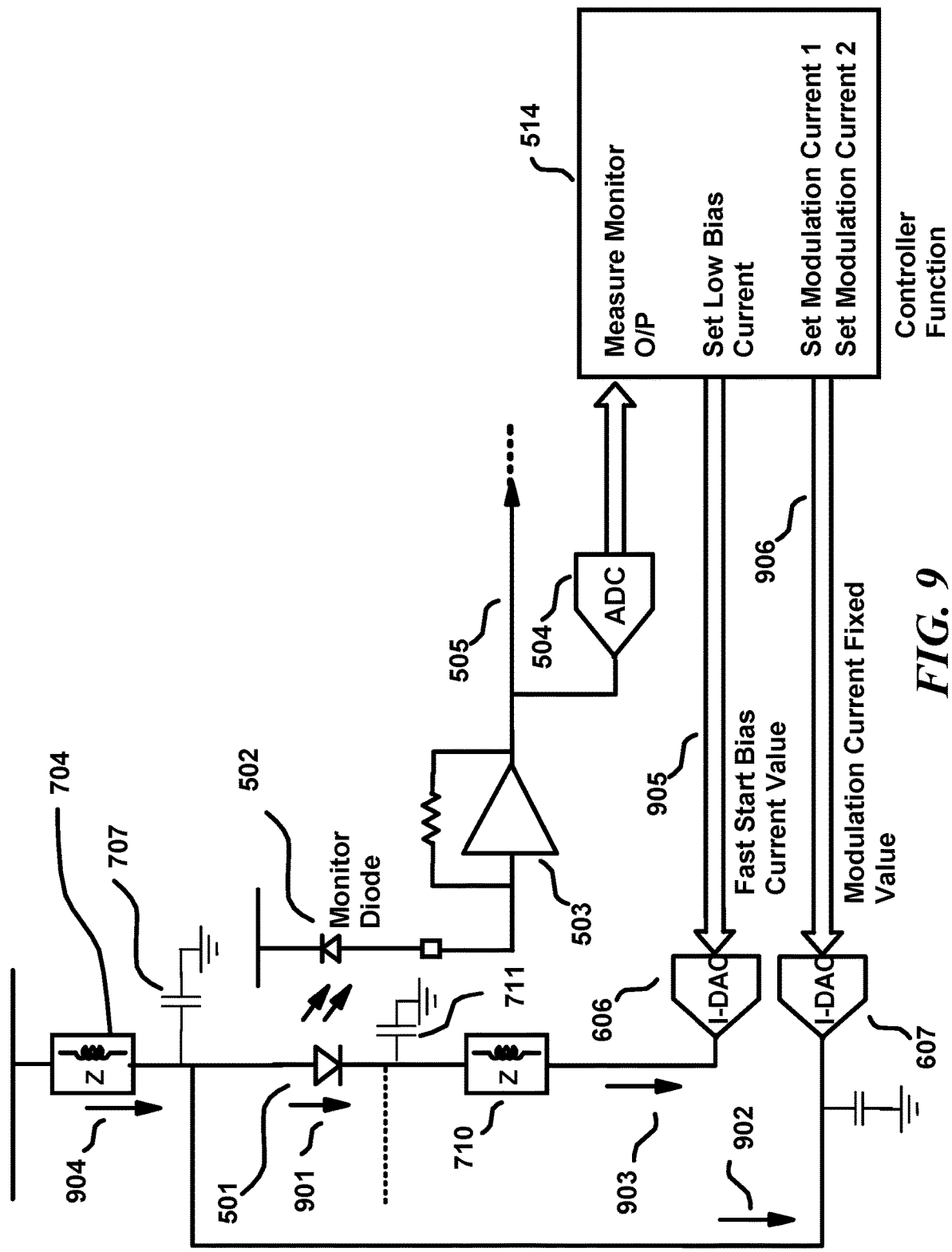
FIG. 9 shows an arrangement for providing run-in burst drive currents in an arrangement employing differential laser drive according to prior art.

FIG. 9 shows a simplified arrangement for an embodiment of a laser driver circuit according to prior art wherein calibration pulses or bursts are applied to the laser during a run-in period in order to determine suitable settings for the bias and modulation levels required for normal data transmission. The switching functions provided to control the routing of the modulation and bias currents 702, 703 have fixed settings during the calibration sequence, and hence have been omitted for clarity in this figure. Note that in FIG. 9, the modulation current switching function is set to divert the modulation past the laser. The modulation current may be set to a convenient value, or set to zero. These settings are not essential provided that the contribution of said modulation current is accounted for in the calculations associated with the calibration current values. At the start of the calibration operation the bias current is first set to a convenient lower value to provide the first calibration pulse or burst, and the optical output of the laser is sensed and the output 505 of monitoring TIA is stored in the controller function 514. Then the bias current is set to a convenient higher value to provide a second calibration burst or pulse, and the corresponding optical output of the laser is sensed and stored in the controller function. In an ideal situation, the controller is then able to perform the simple calculations, for example, in the manner previously described, in order to determine suitable settings for the bias and modulation currents to normal data transmission.

Figure 10:
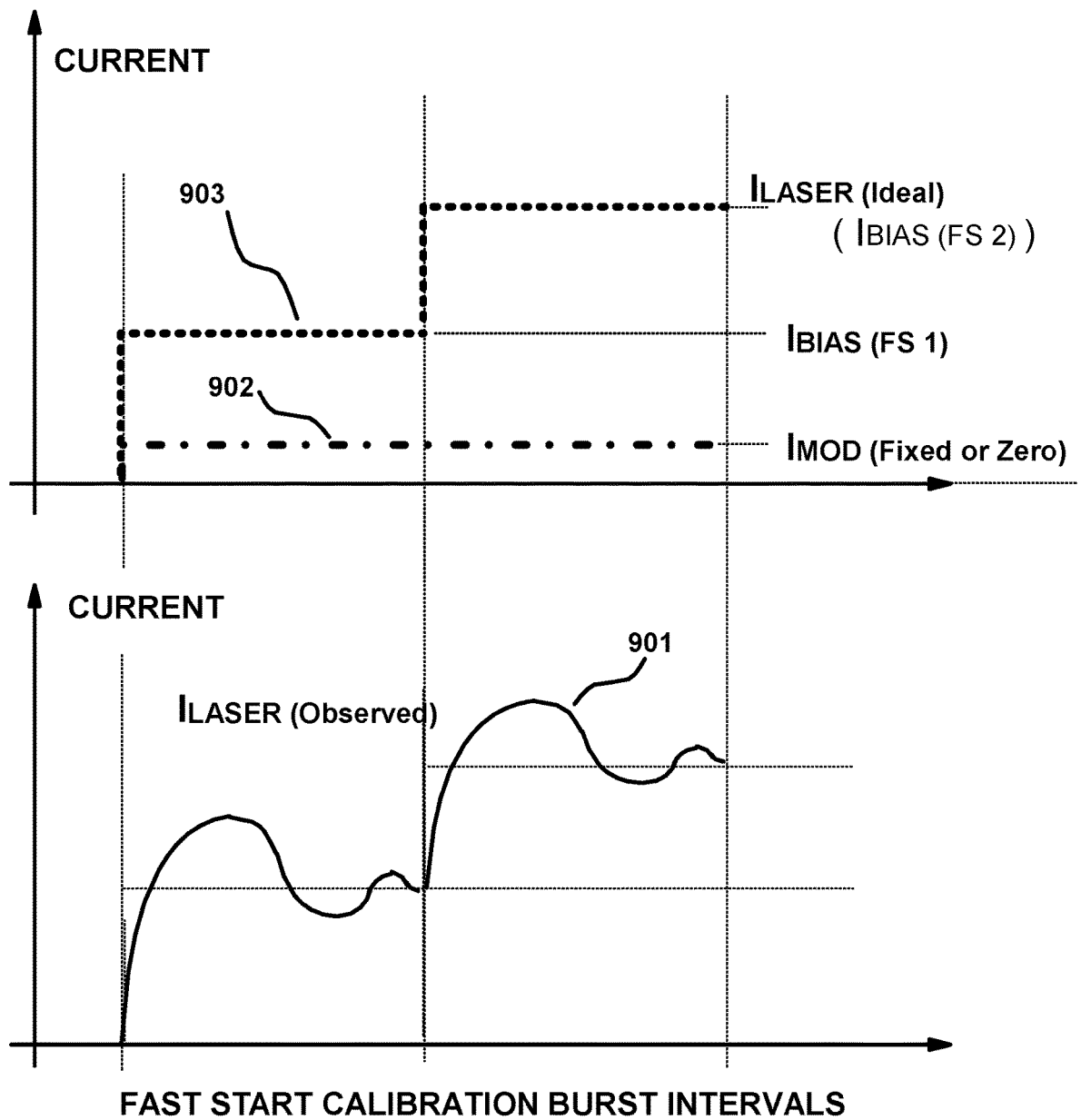
FIG. 10 shows a representation of the electrical waveforms typically present at the laser connections in an arrangement such as in FIG. 10 according to an embodiment of prior art.

FIG. 10 shows in the upper panel a representation of the idealised current flow through the laser during said calibration process. The laser current is assumed to follow the applied current 903 from the bias DAC 606 and settle to the desired value with no significant delay. In the lower panel there is shown a representation of the laser current 901 in a practical situation. Due to the laser coupling choke impedances 704, 710 and the unavoidable parasitic capacitances 707, 711, present in the construction of the BOSA, the response of the laser current to the changes in the supplied current from the bias DAC 606 is likely to exhibit slow settling to its equilibrium value, and also likely to exhibit ringing behaviour. Note that in a practical situation, the impedances associated with the junction of the laser, the choke impedance 704 and parasitic capacitance 707 are likely to be the dominant factors in creating said long settling times, and a solution must take these into account as a priority.

The duration of said settling and ringing of the laser current is also likely to be significant compared with the settling time associated with the monitor photodiode and associated TIA, and also significant compared with the duration of bursts or pulses that can fit within the specified run-in period. This settling of the laser current may therefore become the dominant time constraint in the determination of the laser's optical output corresponding to a given calibration current. Consequently, it becomes difficult or impossible for the controller function to obtain sufficiently reliable measures of the optical output values associated with the first and second calibration current values required to make a meaningful calculation of the required operating current values.

It is this limitation that the present invention seeks to overcome.

Figure 11:
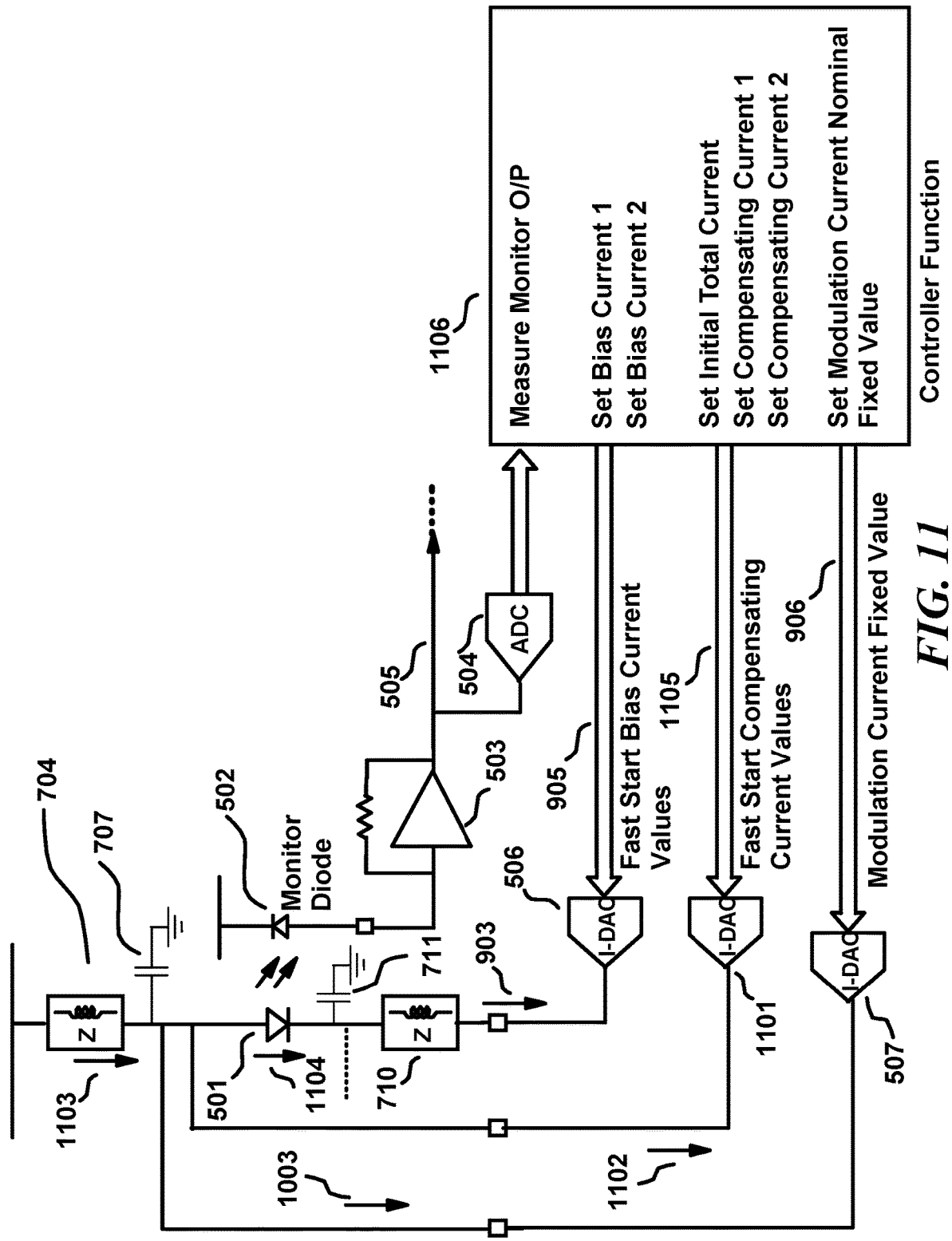
FIG. 11 shows an arrangement for providing a compensating current during the run-in bursts to provide a constant current in the impedance of laser coupling components according to an embodiment of the invention.

FIG. 11 shows an arrangement for driving a laser diode according to an aspect of the invention. In addition to the features shown in FIG. 9, there is provided a further compensating current path from a further DAC 1101, whose output current value is controlled by a digital value 1105. Said digital value 1105 is provided by a modified form of the controller function 1106. During the calibration phase, said modified controller function calculates a value to set the compensating current DAC so that the current flowing through the choke impedance 704 remains substantially constant until the calibration bursts or pulses have finished. Hence, immediately prior to the first calibration burst or pulse, the compensating current value is set to a level equivalent to the current to be provided by the second larger calibration current value, combined with any contribution from the setting of the modulation current 1003 (which may be zero or some other fixed value). At the instant that the bias current setting 905 changes to set the value of the bias DAC 506 for the first calibration current burst or pulse, the setting 1105 for the compensating current DAC 1101 is set so that the compensating current 1102 is reduced by exactly the same amount as the increase in the bias current 903. By these means, the current 1103 flowing through the choke impedance 704, which is generally the dominant reactive component in the arrangement, is held substantially constant. Hence with substantially constant current flowing through the components of the choke impedance 704, there is no significant disturbance of the electrical conditions surrounding the laser, and hence the laser current 1104 will very closely follow the current 903 applied by the bias DAC 506. Note that in a practical embodiment, changes in the current flowing in the choke impedance 710 and associated parasitic elements do not lead to significant settling errors in the current 1104 flowing in the laser.

At the start of the fast start calibration operation when the current in the laser 501 is initially at a zero value, it may be convenient to sense the output 505 of the TIA 503 connected to the monitor photodiode 502 in order to determine the magnitude of any offset or leakage contributions to the sensed value.

To begin the fast start calibration operation, values for the laser current to be used in the fast start process are first determined which respect the absolute maximum current ratings of the laser. A first and a second values are obtained for the bias current 903 which may conveniently be in the range of 25% and 75% of the peak current intended to be used in the normal transmission mode. From these two values of bias current 903 to be applied to the laser, a corresponding first and a second values of compensating current 1102 are calculated which when added to the laser current will create a constant current in the choke impedance 704.

Next, the switch controlling the modulation current path 702 is set to connect the fixed modulation current 1003, if any in this process, to by-pass the laser through the choke impedance 704. The switch controlling the bias current path 703 is set so that the bias current 903 flows through the laser.

Prior to the first calibration burst or pulse the bias and modulation currents may be set to zero and the compensation current control 1105 set such that the current 1103 passing through the choke impedance 704 has the same value as the total current that is determined to pass through said choke impedance during subsequent calibration bursts or pulses.

During the first calibration burst or pulse the value of the bias control value 905 is set to the first value to set the bias current 903 to the level required for a first fast start calibration burst or pulse. The modulation control value 906 may set the modulation current 902 to a preferably small fixed value, or said modulation control value may remain in an off state keeping the modulation current at a zero value. At the same instant, the compensation control value 1105 is set to a previously determined first value so that the compensation current DAC 1101 provides an additional current to flow via the choke impedance 704 such that the current through the said choke impedance does not change with the commencement of the calibration bursts or pulses.

The optical output of the laser 501 is then sensed by the photodiode 502 and amplified by the associated TIA 503. After allowing for any settling time associated with said photodiode and TIA, the output 505 of the associated TIA is digitised by an ADC 504 and stored in the controller function 1106.

During the second calibration burst or pulse the bias control value 905 is then set to a second value to set the bias current 903 to the current level required for the second fast start calibration burst or pulse. The modulation control value 906 remains set to a fixed value or an off state. At the same instant, the compensation control value 1105 is changed to reduce the output of the compensation current DAC 1101 so that the compensation current 1102 is reduced by the same amount as the increase in current from the bias DAC to provide the current for the second calibration burst or pulse, so that the while the laser current 1104 has increased, the current 1103 flowing in the choke impedance 704 remains substantially unchanged.

During normal operation for the transmission of data during the defined burst periods, the compensation current 1102 is not required, and this current path is disconnected from the components associated with the laser. This disconnection may be achieved in a variety of ways which will be apparent to one skilled in the art, such as using a switching function, or setting the value of the compensation DAC 1101 to zero.

Figure 12:
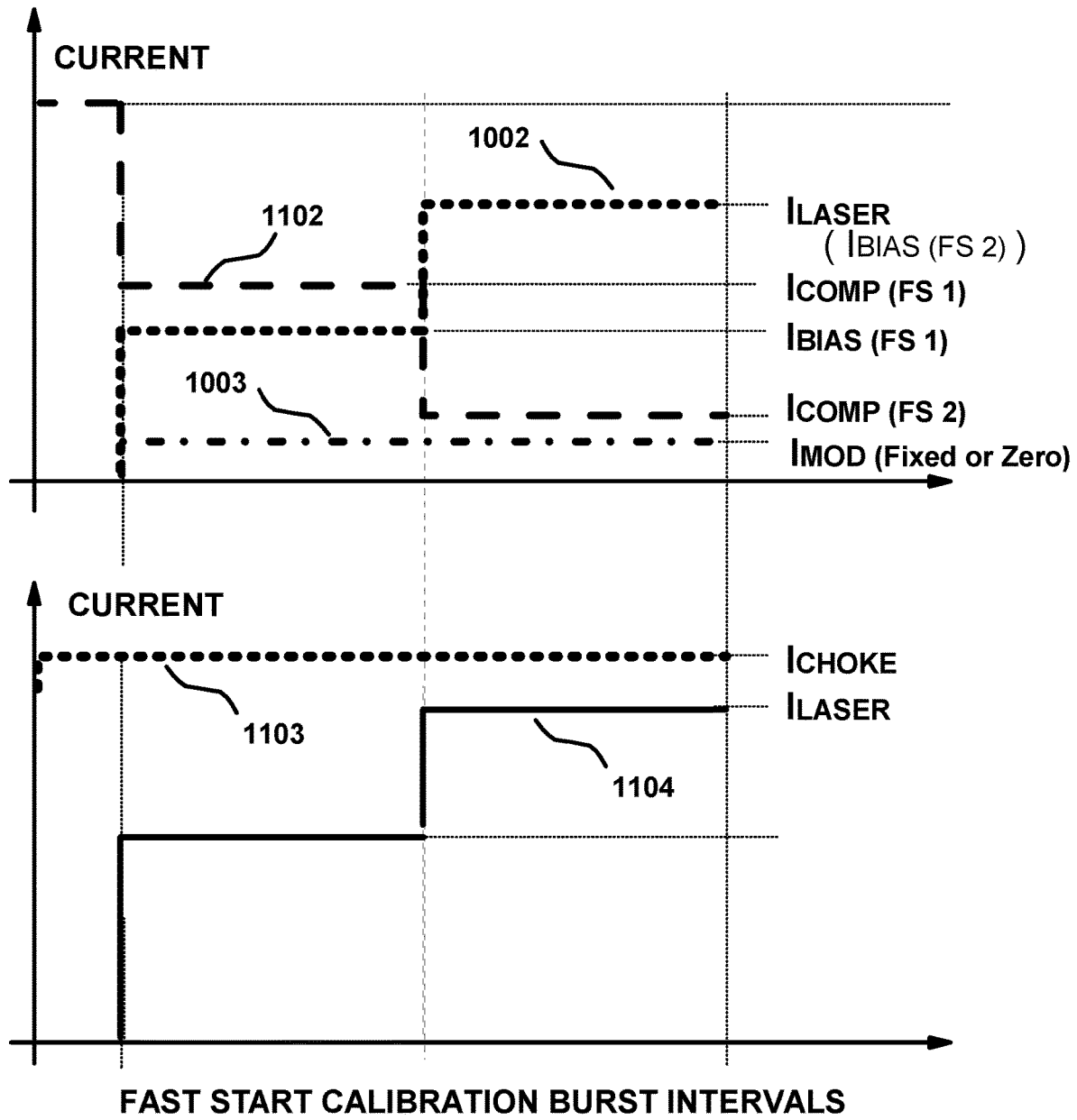
FIG. 12 shows a representation of the currents present in the arrangement of FIG. 11 according to an embodiment of the invention.

FIG. 12 shows a representation of the operation of an arrangement according to an embodiment of the invention as shown and described with reference to FIG. 11. The current 1102 from the compensating source DAC 1101 is seen to be set at the beginning of the calibration operation to a value corresponding to the value of the total current 1103 determined to be flowing in the choke impedance 704 enduring the bursts or pulses of the fast start calibration operation. During the first fast start calibration burst or pulse the value of the compensation current 1102 is seen to decrease by the same amount and the increase in the bias current 903 (and possibly the modulation current) and hence the laser current 1104 so that the current 1103 through the choke impedance 704 remains substantially constant, and the current through the laser 1104 controlling the optical output power remains substantially stable without significant settling errors throughout the period of said first calibration burst or pulse.

During the second fast start calibration burst or pulse, the current 1102 from the compensating source DAC 1101 is seen to decrease further in an amount corresponding the increase in the bias current 903 required to provide the desired level of current in the laser for the second fast start calibration burst or pulse. Consequently, the current 1103 flowing through the choke impedance 704 remains substantially constant, and the current through the laser 1104 controlling the optical output power remains substantially constant without significant settling errors throughout the period of said second calibration burst or pulse.

Hence by means of these features of the present invention it is possible for reliable measures of the optical values corresponding to the current levels used in the calibration bursts or pulses to be acquired, such that the controller function can perform the required calculations to determine the preferred values for the bias 508 and modulation 509 required for desired operation conditions during normal transmission modes.

Figure 13:
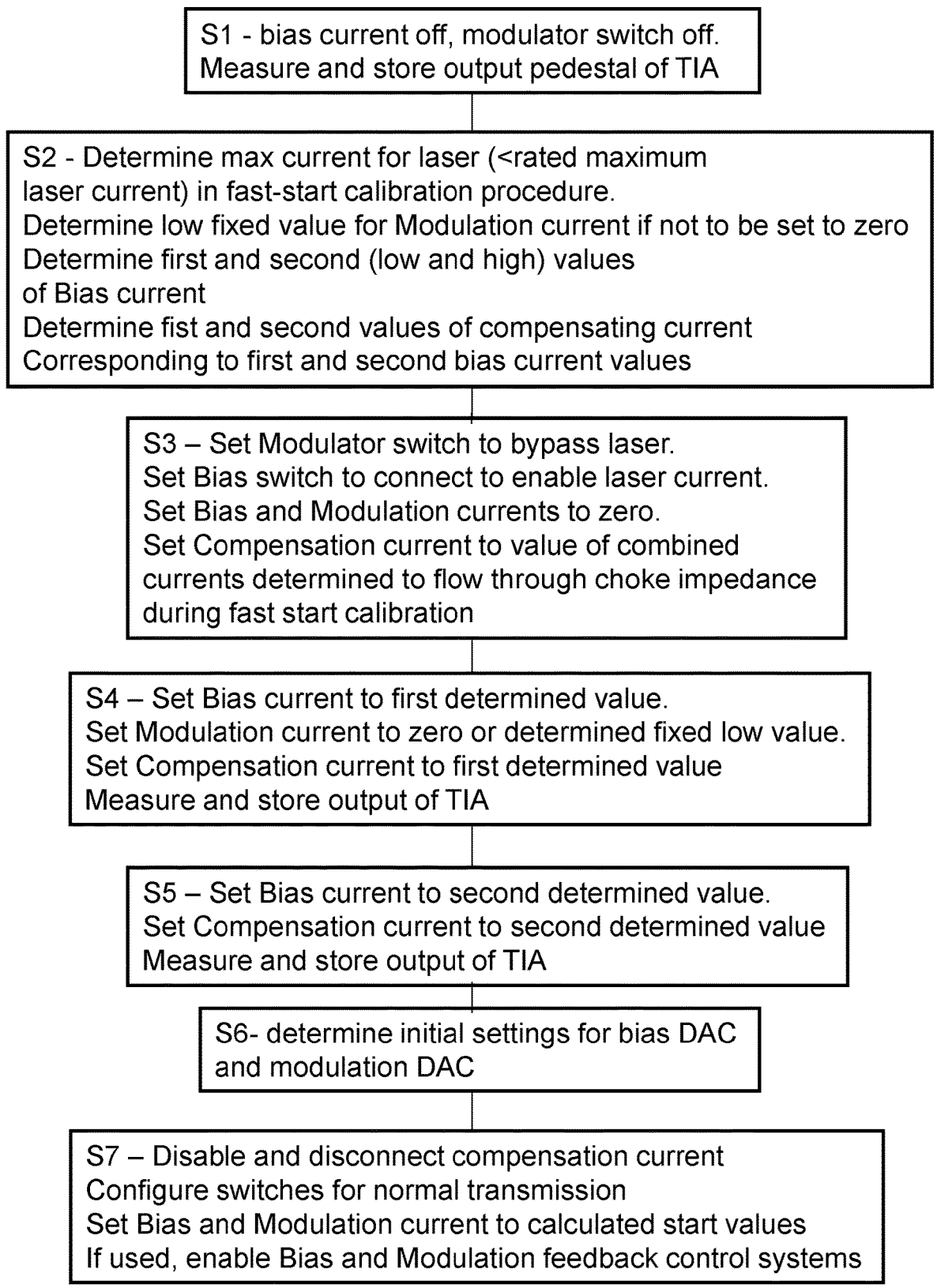
FIG. 13 shows a method of an embodiment of the invention.

An example of a suitable algorithm will now be described with reference to FIG. 13, but one skilled in the art will immediately recognise that many other algorithms will achieve an equivalent or similar function.

For the first step S1, the bias current 903 and the modulation current 1003 are set to zero values. The output of the TIA 505 is measured, digitised by an analogue to digital converter 504 and stored as a pedestal value representing any offset in the calculation.

In the second step, S2, the maximum current to be used in the fast-start procedure is determined, being some value less than the maximum rated current for the laser. If the modulation current is not to be set to zero, a low fixed value for same is determined. A first lower and a second higher value are determined for the bias current to be used in the fast-start procedure. A first and second values for the compensating current are determined, calculated such that the total current to flow through the choke impedance will remain substantially constant.

In the third step, S3, the bias and modulation control switches, 702, 703, are configured such that the bias current passes through the laser and the modulation current by-passes the laser. The bias current and modulation current are set to zero. The compensation current 1102 is turned on and set to a value equal to a value determined as the maximum value of the combined currents that flow through the choke impedance 704 during the first and second bursts or pulses of fast start calibration procedure.

In a fourth step, S4, the modulation current is set to zero or determined low fixed value. During the first calibration burst or pulse, the bias current is set to a first determined value, and the compensation current set to a corresponding first determined value. The output of the TIA is then measured, digitised and stored for the subsequent fast start calibration calculations.

In a fifth step, S5, during the second calibration burst or pulse, the bias current is set to a second determined value, and the compensation current set to a corresponding second determined value. The output of the TIA is then measured, digitised and stored for the subsequent fast start calibration calculations.

In a sixth step, the controller function processes the values stored during the calibration procedure and calculates initial settings for the bias DAC 506 and modulation DAC 507 to provide the desired average optical power and extinction ratio.

In a seventh step, S7, the compensation current source is disabled and disconnected from the laser drive circuitry. The bias and modulation current switches 702, 703, are set to the normal operation conditions for normal transmission of data. The bias and modulation currents are enabled using the DAC settings calculated in step 6. If used in the particular application, any feedback control system available is enabled to monitor and update the bias and modulation current setting during the period of transmission.

Various embodiments with different variations have been described here above. It should be noted that those skilled in the art may combine various elements of these various embodiments and variations. Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. A system for communication wherein information is transmitted in at least one burst, the system comprising:
    drive circuitry coupled to a laser diode, said drive circuitry configured to apply, in a start-up phase prior to an operating phase, a first drive current and then a second drive current to flow through said laser diode, said first drive current and second drive current being different and such that said laser diode is configured to provide a first optical output and a second, different, optical output respectively;
    a compensating current source further coupled to a terminal of said laser diode, said compensating current source configured to provide a current related to the first and second drive currents and further configured to not to flow through said laser diode and configured to maintain a combined current flowing through at least one impedance connected to said laser diode at a substantially constant level during the said start-up phase;
    an optical sensor configured to provide a first sensor output corresponding to said first optical output of said laser diode and a second sensor output corresponding to said second optical output; and
    a controller configured to use a value of said first drive current, a value of said second drive current, said first sensor output, said second sensor output and at least one supplied input value to provide control values for said drive circuitry to control an operating current of said laser diode during the operating phase wherein the information is transmitted in the at least one burst.

2. A system as claimed in claim 1, wherein said operating current comprises an average current and a modulation current, and said controller is configured to use said value of said first drive current, said value of said second drive current, said first sensor output and said second sensor output and said at least one supplied input to determine an average current value and a modulation control value and provide control values in dependence on said average current and modulation control values.

3. A system as claimed in claim 1, wherein said at least one impedance is connected between said laser diode and a system power supply.

4. A system as claimed in claim 3, wherein said at least one impedance connected between said laser diode and said system power supply comprises at least one inductance.

5. A system as claimed in claim 4, wherein said controller is configured to use said value of said first drive current, said value of said second drive current to determine respectively a first value of a compensating current and a second value of a compensating current such that the total current passing through said impedance connected between said laser diode and said power supply remains substantially constant during said provision of said first and second drive currents.

6. A system as claimed in claim 5, wherein said drive circuitry is configured to provide said average current applied to said laser diode and said modulation current applied to said laser diode based on said control values.

7. A system as claimed in claim 4, wherein an impedance is connected to a terminal of said laser diode not connected to said at least one inductance.

8. A system as claimed in claim 1, wherein said operating current comprises a maximum operational current and a minimum operational current to be applied by said drive circuitry to said laser diode and said controller is configured to use said value of said first drive current, said value of said second drive current, said first sensor output, said second sensor output and said at least one supplied input to determine a minimum operational current value to be applied by said drive circuitry to said laser diode and a maximum operational current value to be applied by said drive circuitry to said laser diode and provide control values in dependence on said maximum operational current value and said minimum operational current value.

9. A system as claimed in claim 8, wherein said drive circuitry is configured to provide said maximum operational current value and said minimum operational current value applied to said laser diode based on said control values.

10. A system as claimed in claim 8, wherein said minimum operational current value is used for data '0' and said maximum operational current is used for data '1'.

11. A system as claimed in 1, wherein said operating current comprises a bias current and a modulation current to be applied by said drive circuitry to said laser diode and said controller is configured to use said value of said first drive current, said value of said second drive current, said first sensor output, said second sensor output and at least one supplied input to determine a bias current value and a modulation control value and apply control values in dependence on said bias current value and said modulation control value.

12. A system as claimed in claim 11, wherein said drive circuitry is configured to provide said bias current applied to said laser diode and said modulation current applied to said laser diode based on said control values.

13. A system as claimed in claim 1, wherein said first and second drive currents are applied within a timing of a single burst.

14. A system as claimed in claim 1, wherein said first and second drive currents are applied within a timing of respective bursts.

15. A system as claimed in claim 1, wherein said optical sensor comprises a photodiode.

16. A system as claimed in claim 15, wherein said optical sensor comprises an analogue to digital convertor configured to convert said output of said photodiode to a digital value to provide said first and second sensor outputs.

17. A system as claimed in claim 1, comprising a feedback loop configured to use outputs from said optical sensor and one or more stored reference values to compensate for changes in behaviour of said laser diode after said start-up phase.

18. A system as claimed in claim 1, wherein said drive circuitry is configured such that when no current is applied to said laser diode a respective output of said optical sensor is used to correct said first and second sensor output values.

19. A system as claimed in claim 1, wherein said first and second drive current values are configured to cause said laser diode to be operated within a substantially linear region of operation.

20. A method for communications using at least one burst comprising:
    applying to a laser diode in a start-up phase a first drive current and then a second, different, drive current to flow through a laser diode, said first drive current and second drive current being such that said laser diode is configured to provide a first optical output and a second, different, optical output respectively;
    providing a first sensor output corresponding to said first optical output of said laser diode and a second sensor output corresponding to said second optical output; and
    using a value of said first drive current, a value of said second drive current, said first sensor output, said second sensor output and said at least one supplied input to provide control values to control an operating current of said laser diode;
    applying a compensating current to a terminal of said laser diode, said compensating current being configured to not to flow through said laser diode and configured to maintain a combined current flowing through at least one impedance connected to said laser diode at a substantially constant level during the said start-up phase; and
    providing a controller configured to use a value of said first drive current, a value of said second drive current, said first sensor output, said second sensor output and at least one supplied input value to provide control values for said drive circuitry to control an operating current of said laser diode during the operating phase wherein the information is transmitted in the at least one burst, and to further supply a first and second value of said compensating current during said start-up phase.

* * * * *